United States Patent
Knee et al.

(10) Patent No.: US 10,027,303 B2
(45) Date of Patent: Jul. 17, 2018

(54) MANAGEMENT OF BROADCAST AUDIO LOUDNESS

(71) Applicant: Snell Advanced Media Limited, Newbury (GB)

(72) Inventors: Michael James Knee, Petersfield (GB); Daniel Colgan, Southampton (GB); Maurice Snell, Petersfield (GB)

(73) Assignee: Snell Advanced Media Limited, Newbury (GB)

( * ) Notice: Subject to any disclaimer, the term of this patent is extended or adjusted under 35 U.S.C. 154(b) by 0 days.

(21) Appl. No.: 15/636,840

(22) Filed: Jun. 29, 2017

(65) Prior Publication Data

US 2017/0302241 A1    Oct. 19, 2017

Related U.S. Application Data

(60) Continuation-in-part of application No. 15/153,910, filed on May 13, 2016, now abandoned, which is a
(Continued)

(30) Foreign Application Priority Data

Nov. 13, 2012    (GB) .................................. 1220426.9

(51) Int. Cl.
*H04H 20/47*    (2008.01)
*H03G 3/32*    (2006.01)
(Continued)

(52) U.S. Cl.
CPC ............... *H03G 3/32* (2013.01); *H03G 9/005* (2013.01); *H03G 9/025* (2013.01)

(58) Field of Classification Search
CPC .... H03G 3/3005; H03G 3/301; H03G 3/3015; H03G 3/3021; H03G 3/3052;
(Continued)

(56) References Cited

U.S. PATENT DOCUMENTS 4,052,571 A * 10/1977 Gregory ............... H04R 25/356
  333/14
4,292,467 A *  9/1981 Odlen ................... H03J 5/0254
  381/1
(Continued)

FOREIGN PATENT DOCUMENTS

EP    2 299 590 A1    3/2011
EP    2 352 225 A1    8/2011
(Continued)

OTHER PUBLICATIONS

Search report from priority application No. 1220426.9. dated Oct. 19, 2013.
(Continued)

*Primary Examiner* — Leshui Zhang
(74) *Attorney, Agent, or Firm* — Woodard, Emhardt, Moriarty, McNett & Henry LLP; William McKenna; Kenneth Gandy

(57) ABSTRACT

To control loudness during a junction between different types of broadcast content, such as a junction between program and commercial or promotional content, representative loudness values for content respectively before (P) and after (C) the junction are received from a playout automation system. A time-varying gain control is applied before and after the junction in order to smooth loudness around the junction. The audio gain is smoothly increased prior to the junction to a gain (P+C)/2P times higher than the original gain value. Then, the gain is reduced shortly before the junction to a value (P+C)/2C times lower than the original gain value. After the junction, the gain is returned smoothly to the original value.

5 Claims, 3 Drawing Sheets

Related U.S. Application Data division of application No. 14/078,640, filed on Nov. 13, 2013, now Pat. No. 9,344,052.

(51) Int. Cl.
*H03G 9/00* (2006.01)
*H03G 9/02* (2006.01)

(58) Field of Classification Search
CPC .......... H03G 3/3057; H03G 3/32; H03G 7/00; H03G 7/004; H03G 9/025; H03G 9/005; H03G 9/10; H03G 9/18; H03G 11/00; H03G 11/006; H03G 11/008; H03G 11/02; H03G 11/025; H03G 11/08; H03G 11/04; H03G 2201/10; H03G 2201/103; H03G 2201/106; H03G 2201/20; H03G 2201/202; H03G 2201/30; H03G 2201/302; H03G 2201/40; H03G 2201/50; H03G 2201/508; H03G 2201/60; H03G 2201/603
USPC ...... 381/56, 57, 58, 59, 60, 2, 10, 100, 101, 381/102, 103, 104, 106, 107, 108, 110, 381/28, 120; 330/278, 281, 4.9, 287; 700/94; 455/200.1, 177.1, 219, 355, 455/127.2, 136, 138, 232.1, 239.1, 240.1, 455/245.1, 247.1, 250.1
See application file for complete search history.

(56) References Cited

U.S. PATENT DOCUMENTS

| | | | | |
|---|---|---|---|---|
| 5,666,384 A * | 9/1997 | Kuban | ............... | H03G 3/32 375/285 |
| 5,883,963 A | 3/1999 | Tonella | | |
| 7,277,550 B1 * | 10/2007 | Avendano | ............... | G10L 21/02 381/103 |
| 7,319,764 B1 | 1/2008 | Reid et al. | | |
| 8,744,855 B1 * | 6/2014 | Rausch | ............... | G06F 17/27 235/375 |
| 8,965,774 B2 * | 2/2015 | Eppolito | ............... | H03G 7/007 381/106 |
| 2003/0084441 A1 | 5/2003 | Hunt | | |
| 2007/0076905 A1 * | 4/2007 | Konagai | ............... | H04R 1/403 381/104 |
| 2007/0177743 A1 * | 8/2007 | Mertens | ............... | H04N 5/607 381/107 |
| 2008/0013745 A1 | 1/2008 | Chen | | |
| 2008/0089524 A1 * | 4/2008 | Takeuchi | ............... | H03G 3/32 381/57 |
| 2008/0095385 A1 | 4/2008 | Tourwe | | |
| 2008/0253586 A1 | 10/2008 | Wei | | |
| 2009/0062943 A1 * | 3/2009 | Nason | ............... | H04N 5/60 700/94 |
| 2009/0074209 A1 * | 3/2009 | Thompson | ............... | H03G 9/005 381/107 |
| 2009/0097665 A1 * | 4/2009 | L'Esperance | ............... | G10K 11/175 381/57 |
| 2009/0116665 A1 * | 5/2009 | Grove | ............... | H04S 1/007 381/106 |
| 2009/0274322 A1 | 11/2009 | Chang et al. | | |
| 2009/0290721 A1 * | 11/2009 | Goldstein | ............... | H04R 1/1041 381/74 |
| 2009/0290728 A1 * | 11/2009 | Berg | ............... | H03F 1/34 381/121 |
| 2010/0166225 A1 * | 7/2010 | Watanabe | ............... | H03G 3/32 381/107 |
| 2010/0198377 A1 * | 8/2010 | Seefeldt | ............... | H03G 3/3005 700/94 |
| 2010/0208918 A1 | 8/2010 | Noguchi | | |
| 2010/0217413 A1 * | 8/2010 | Seiler | ............... | H04R 3/12 700/94 |
| 2010/0272290 A1 * | 10/2010 | Carroll | ............... | H03G 3/3089 381/107 |
| 2011/0150242 A1 * | 6/2011 | Zong | ............... | H03G 9/005 381/107 |
| 2012/0328115 A1 * | 12/2012 | Wolters | ............... | H03G 9/00 381/57 |
| 2013/0272543 A1 * | 10/2013 | Tracey | ............... | H03G 3/32 381/107 |
| 2014/0016791 A1 * | 1/2014 | Smith | ............... | H03G 3/20 381/57 |
| 2014/0093100 A1 * | 4/2014 | Jeong | ............... | H04R 27/00 381/107 |
| 2015/0205576 A1 * | 7/2015 | McCarthy | ............... | H03G 3/32 700/94 |

FOREIGN PATENT DOCUMENTS

WO    WO 2005/111852 A2    11/2005
WO    WO 2013/130033 A1    9/2013

OTHER PUBLICATIONS

Search report from priority application No. GB1220426.9. dated May 20, 2013.

* cited by examiner

MANAGEMENT OF BROADCAST AUDIO LOUDNESS

CROSS-REFERENCE TO RELATED APPLICATION

This application is a continuation-in-part of and claims priority from U.S. patent application Ser. No. 15/153,910 filed May 13, 2016 which is a divisional application of and claims priority to U.S. patent application Ser. No. 14/078,640 filed Nov. 13, 2013 which claims the benefit of Great Britain Application No. GB 1220426.9, filed Nov. 13, 2012, the entire disclosure of which is hereby incorporated by reference.

FIELD OF THE INVENTION

This invention concerns the management of broadcast audio loudness.

BACKGROUND OF THE INVENTION

The management of the subjective loudness of broadcast audio signals, both in radio and television, has been important since the early days of broadcasting. While the viewer or listener invariably has control over the overall volume level of the content they are observing, it is important for the broadcaster to manage the variations in perceived loudness over the course of a programming schedule to meet the requirements of intelligibility, comfort, impact and artistic expression. These requirements can come into conflict. For example, classical music may require a high dynamic range in order that the listener may appreciate the contrasts between solo instruments playing quiet passages and the full orchestra, complete with percussion, reaching a climax in the piece. However, the limitations of a particular transmission channel and listening environment often require a lower dynamic range, to prevent either the quiet passages being inaudible or the loud passages being distorted. The technique of compression (not to be confused with bandwidth or bit rate reduction) has long been used to adapt the dynamic range to the conditions of the channel or listening environment. In the move from analogue to digital broadcasting, and with the increasing quality of home amplification and loudspeaker systems, compression has become less desirable.

Another significant area of conflict in the management of loudness concerns the relative perceived loudness of programme content and commercials or promotional content. In a film or television drama, the director achieves significant artistic impact through the dramatic use of contrasts between quiet and loud scenes. In order to accommodate both, the average loudness of such a programme may be quite low. Conversely, in a television commercial, the director's goal is to maximize impact over the short duration of the commercial, a goal which is often achieved by making the commercial loud. In the days of analogue broadcasting, when compression was applied quite strongly, the subjective discrepancy between the loudness of programmes and commercials was not a significant problem. In digital broadcasting, however, this discrepancy has become a significant source of annoyance for viewers and listeners.

Two developments have helped to overcome this problem. The first is the emergence and standardization of reliable methods of measuring, controlling and logging subjective loudness. These methods are described in ITU Standard BS-1770, "Algorithms to measure audio programme loudness and true-peak audio level" and EBU Recommendation R128, "Loudness normalisation and permitted maximum level of audio signals". The second development is the political will of broadcast industry regulators to introduce rules, and in some cases legislation, to control the relative loudness of programmes and commercials, for example in the CALM (Commercial Advertisement Loudness Mitigation) Act introduced by the FCC in the U.S. Such rules impose limits on the relative loudness of commercials and the programmes they accompany.

These developments have led to a significant improvement in the overall comfort of viewers and listeners as concerns audio loudness. However, the inventors have recognized that there remains the potential for annoyance at the junctions between programmes and commercials, even when legal and contractual requirements for average loudness have been met. A typical scenario is when a fast-action drama ends with a relatively silent scene. An abrupt transition from such a scene to a loud commercial can cause considerable annoyance to the observer. An equivalent transition within a programme is not so much of a problem because it will have been introduced for artistic effect.

It is the object of this invention to provide, for both live and pre-recorded broadcasting, a method and apparatus for mitigating the effect of abrupt loudness transitions at junctions between programmes and commercials or promotional content.

SUMMARY OF THE INVENTION

The invention consists in a method and apparatus for controlling loudness during a junction between different types of broadcast content, in particular a junction between programme and commercial or promotional content, in order to reduce the adverse effects of an abrupt increase in perceived loudness.

In a first embodiment of the invention, the time of the junction is identified in advance, a representative loudness value is obtained for a period leading up to the junction, and a time-varying gain control is applied to the content following the junction in order to bring its loudness smoothly from the representative value to its original value.

In a second embodiment, representative loudness values for content before and after the junction are read from a playout automation system, and a time-varying gain control is applied before and after the junction in order to bring the loudness smoothly from the first representative value to the second representative value.

In a third embodiment of the invention, a continuous measurement of a representative loudness value is obtained, and a time-varying gain control is applied to the content following the junction in order to bring its loudness smoothly from the representative value sampled near the time of the junction to its original value.

The present invention also consists in one aspect in method for controlling loudness during a junction between different types of broadcast content, such as a junction between programme and commercial or promotional content, the method comprising the steps of obtaining a first representative loudness value before the junction; obtaining a second representative loudness value after the junction; and applying a time-varying gain control to the content before and/or after the junction in order to smooth its loudness value across the junction So, in some embodiments of the invention, in response to information provided by a broadcast automation system, the loudness at or near each junction is gradually adjusted in order to reduce the abruptness of the transition while respecting both the artistic intentions of the programme maker and the need for commercials to have high impact.

BRIEF DESCRIPTION OF THE DRAWINGS

The invention will now be described by way of example with reference to the accompanying drawings, in which.

DESCRIPTION OF PREFERRED EMBODIMENTS

In the description that follows, the content prior to the junction will be referred to as the "programme" and the content after the junction the "commercial" without precluding other types of broadcast content on either side of the junction. The term "broadcast" is used in general sense and is intended to cover the delivery of content in a wide variety of forms, including streaming via the Internet.

Figure 1:
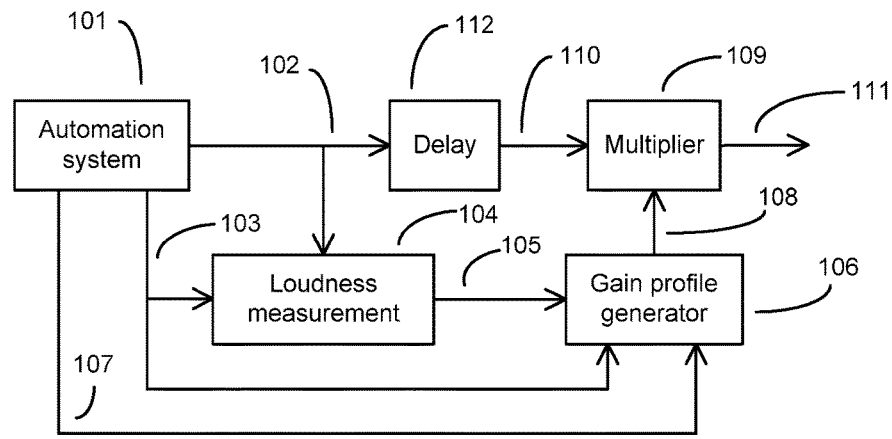
FIG. 1 is a block diagram illustrating a first embodiment.

A first embodiment of the invention is illustrated in FIG. 1. This embodiment may be used in the case of live broadcasting where the loudness of the programme is not known in advance, but the loudness of the commercial in the period following the junction has a known value C. In this embodiment, an automation system (101) controls the playout of a broadcast audio signal (102). Suppose a junction in the audio signal (102) between programme and commercial occurs at time t0. At time t1, which is a known, fixed period before the junction, the automation system (101) sends a trigger signal (103) to a loudness measurement device (104), instructing it to begin loudness measurement. A suitable period (t0–t1) might be 15 seconds. At time t2, a much shorter period before the junction, the loudness measurement device (104) stops capturing data for loudness measurement and calculates an average or other representative loudness value P (105) of the input signal (102) over the period (t2–t1). A suitable short period (t0–t2) might be 0.25 seconds, so that in this example the average loudness would be calculated over a period of 14.75 seconds. The average loudness P (105) is passed to a gain profile generator (106) which also receives the commercial loudness value C (107) from the automation system (101). The output (108) of the gain profile generator (106) has a default value of unity. The gain profile generator (106) performs the following operations. If P is greater than or equal to the commercial loudness value C (107), no further action is taken and the output (108) of the gain profile generator (106) remains at unity. If, however, P<C, then the gain profile generator (106) generates a ramp signal which has a value G<1 from time t2 to time t0, followed by a value g(t) which increases steadily from G to 1 from time t0 to a later time t3, after which the output remains at 1. A suitable choice for t3 would be 5 seconds after time t0. The output (108) of the gain profile generator (106) is applied to a multiplier (109) which acts on a delayed version (110) of the input signal (102) to produce the output of the system (111). The delay (112) compensates for the typically very short latencies of the loudness measurement device (104) and of the gain profile calculator (106). The value of G is chosen such that when a gain G is applied to a signal of loudness C then the output loudness will be P. If loudness is expressed in the linear domain, then G=P/C.

Figure 2:
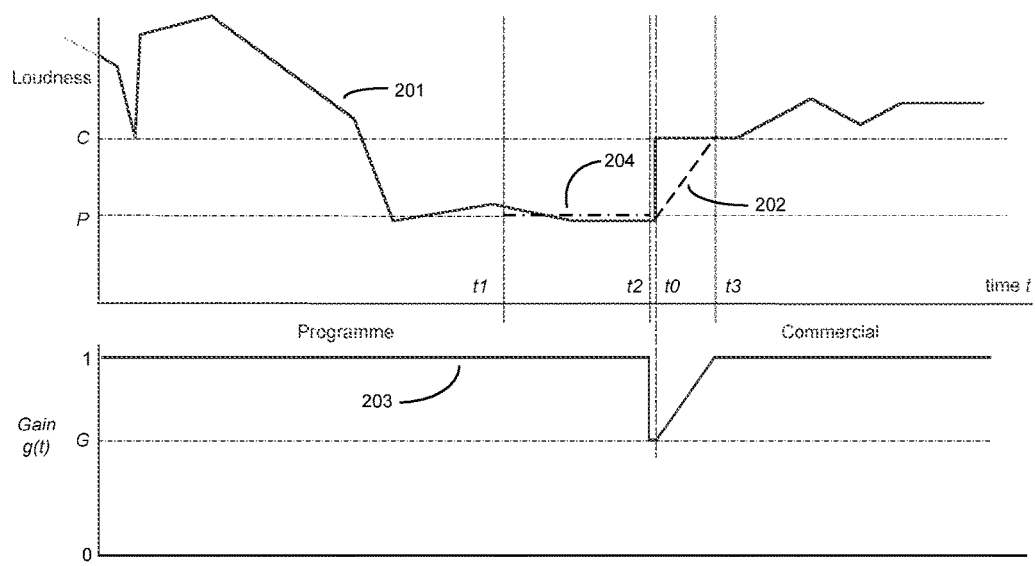
FIG. 2 is a timeline useful in understanding the operation of the embodiment of FIG. 1.

The effect of the first embodiment will now be described with reference to FIG. 2, which shows time-plots of loudness (201) at the input to the system, shown by a bold line, loudness (202) at the output of the system, shown by a dotted line where it differs from the input loudness, and the gain g(t) (203) applied by the system. Before time t2 the loudness of the programme is unaffected, the gain remaining at 1. Between t1 and t2 the loudness of the programme is measured; its average value P is shown on the graph (204). At time t2 the gain is adjusted to the value G and the programme loudness is reduced for a short period. At time t0 the content switches to the commercial and its loudness is reduced from C to P. Between t0 and t3 the gain is gradually increased from G to 1 and the loudness is gradually increased from P to C. The invention has thus achieved a smooth transition in loudness across the junction. In this example, the input loudness of the commercial up to time t3 has been shown at a constant value of C to ease explanation, but the principles of the invention would apply equally in the case that the loudness of the commercial varied between t0 and t3. In that case the output loudness of the commercial would gradually approach its input loudness.

A variation of the first embodiment of the invention will now be described. This variation may be used when the commercial cannot be analysed in advance. In this case, an assumption is made that the commercial begins at its maximum permissible loudness, which we denote Cmax. This value is used in place of a known loudness value provided by the automation system.

Figure 3:
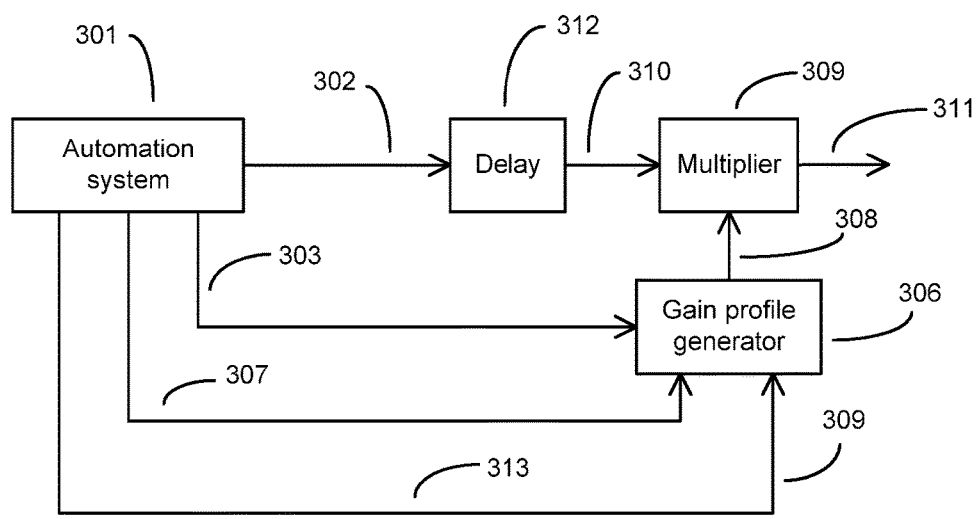
FIG. 3 is a block diagram illustrating a second embodiment.

A second embodiment of the invention will now be described. This embodiment may be used when the programme is pre-recorded and information about its loudness is known in advance. Referring to FIG. 3, an automation system (301) controls the playout of a broadcast audio signal (302). As already described, a junction in the audio signal (302) from programme to commercial occurs at time t0. At time t4, which is a known, fixed period before the junction, the automation system (301) sends a trigger signal (303) to a gain profile generator (306). A suitable period (t0–t4) would be 5.25 seconds. Starting at time t4 and ending at time t3 already defined, the gain profile generator generates a gain control signal (308) which starts by steadily increasing the gain, reaching a value of G2 at time t2 already defined, and which then reduces the gain abruptly to G3 so as to avoid a jump in loudness. At time t0, the moment of the junction, the gain profile generator generates a steadily increasing gain control signal, reaching a value of 1 at time t3. We now describe how G2 and G3 are calculated, using the simplifying assumptions that time periods t2–t4 and t3–t0 are equal and that the loudness is expressed as a linear quantity. The aim is to take the loudness smoothly from P to C, so there is a target loudness value of (P+C)/2 at the junction. This leads to a gain value before the junction of G2=(P+C)/2P, and a gain value after the junction of G3=(P+C)/2C.

Figure 4:
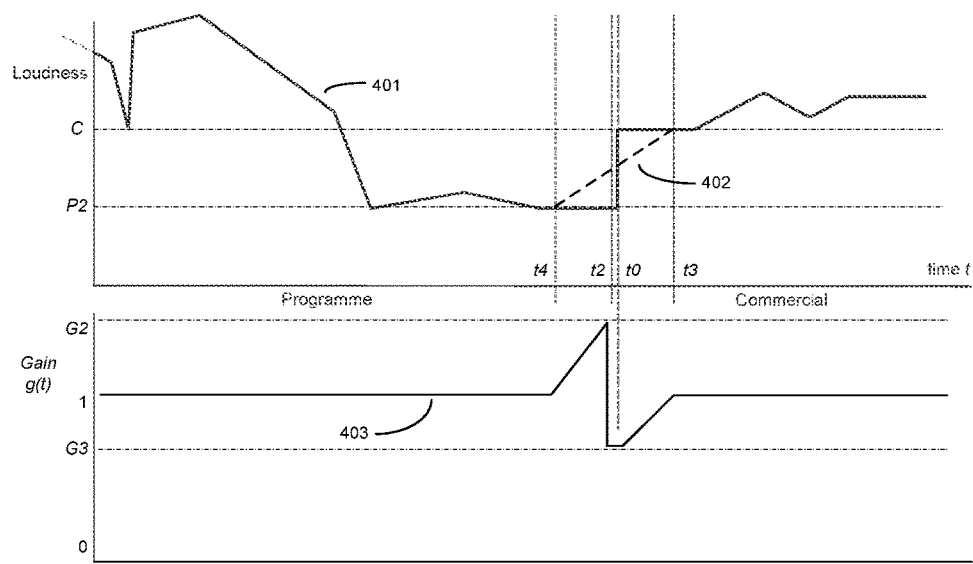
FIG. 4 is a timeline useful in understanding the operation of the embodiment of FIG. 3.

The effect of the second embodiment will now be described with reference to FIG. 4, which shows time-plots of loudness (401) at the input to the system, shown by a bold line, loudness (402) at the output of the system, shown by a dotted line where it differs from the input loudness, and the gain g(t) (403) applied by the system. Before time t4 the loudness of the programme is unaffected, the gain remaining at 1. Between t4 and t2 the gain is steadily increased from 1 to G2=(P+C)/2P. At time t2 the gain is switched to the value G3=(P+C)/2C. At time t0 the content switches to the commercial and its loudness is reduced from C to (P+C)/2. Between t0 and t3 the gain is gradually increased from G3 to 1 and the loudness is gradually increased from (P+C)/2 to C. In this example, the input loudness of the programme from time t4 and the input loudness of the commercial up to time t3 have been shown at constant values of P and C respectively to ease explanation, but the principles of the invention would apply equally in the case that the loudness of the content varied between t4 and t3. In that case the output loudness of the programme would gradually depart from its input loudness and the output loudness of the commercial would gradually approach its input loudness.

In certain applications, it may be preferable to leave the loudness of the commercial unchanged and to smooth the loudness value across the junction by varying gain only during the programme. In this case, the target loudness at the junction is C instead of (P+C)/2. To achieve this, the gain is increased smoothly over a time period before the junction from its original value to C/P times its original value. In this case, there would be no need for a gradual restoration of the gain value after the junction; the gain in this case would in fact be abruptly restored to its original value.

More generally, it is possible to define a relative importance A of preserving the loudness of the commercial. If A=1, so that preserving commercial loudness is of overriding importance, perhaps for contractual reasons, then we have the situation described above. If A=0.5, so that it is equally important to preserve commercial loudness as it is to preserve programme loudness, then we have the situation illustrated in FIG. 4. Conversely, if A=0, so that preserving programme loudness is of overriding importance, then we have the situation generally as illustrated in FIG. 2. Of course, the arrangement of FIGS. 1 and 2 was described above in a context in which the loudness of the programme was not known in advance. What is being suggested in this variation is that even in a situation in which the programme loudness is known in advance, a choice can be made (through setting a value A=0) not to vary the loudness of the programme.

In general, the target loudness at the junction is (1−A)P+AC, the gain is smoothly increased prior to the junction to (1−A+AC/P) times its original value, and the gain is smoothly decreased after the junction from ((1−A)P/C+A) times its original value.

The value of A may be a user input and—in a particular content delivery channel—may remain constant over significant periods of time. But, the value of A may also change dynamically with for example programme content and/or with the contractual relationship underlying a commercial. Variations in the value of A may be under the control of an automation system. Where appropriate, values of A (or information required by the automation system in the selection of a value for A) may be carried in metadata associated with the programme and/or the commercial.

Figure 5:
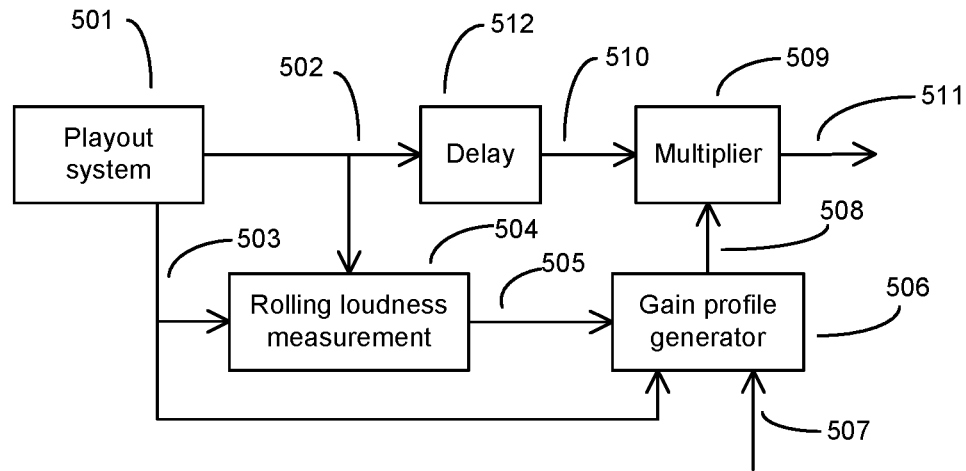
FIG. 5 is a block diagram illustrating a third embodiment.
Figure 6:
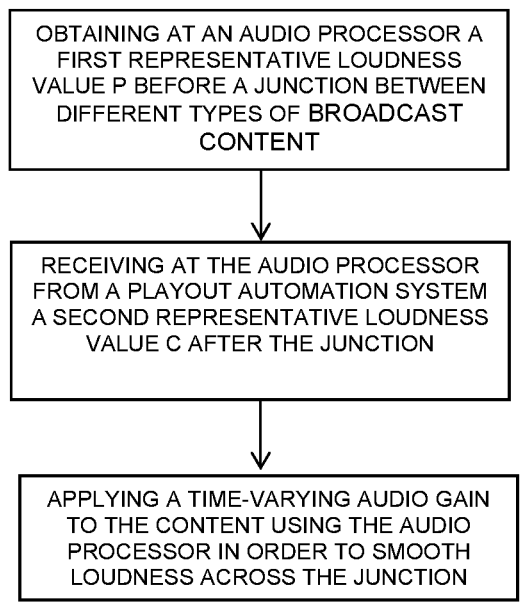
FIG. 6 is a flow chart illustrating a method according to the invention.

A third embodiment of the invention will now be described. This embodiment may be used when no advance information is available either about the loudness of content or the timing of a junction. The following description is given with reference to FIG. 5. A playout system (501), which need not in this case be under the control of a full automation system, plays out broadcast audio (502). The audio signal is applied to a rolling loudness measurement unit (504), which continually updates an average or other representative loudness value for the previous 15 seconds or other fixed period. The playout system (501) emits a trigger (503) at the junction between the programme and the commercial. On receipt of the trigger (503), the rolling loudness measurement unit (505) samples the current loudness value (505) and applies it to the gain profile generator (506), which also receives the trigger (503) and a fixed commercial loudness value (507) which may be a user input. The operation of the gain profile generator (506), delay (512) and multiplier (509) are then as described in the first embodiment.

As in the second embodiment, it may also be desirable to define a relative importance A of preserving the loudness of the commercial, even though that value may be a user input. The target loudness and gain profile calculations would then be performed in the same manner as in the second embodiment. Other configurations are possible without departing from the scope of the invention. In particular, the information about junction timing, interval lengths, representative loudness levels and loudness measurement periods may be obtained in various combinations from a playout automation system, metadata accompanying the signals and user input. The variation of gain with time may be linear, as assumed in the foregoing descriptions, or may have some other smoothly varying characteristic.

The overall impact of the gain variation may be reduced in order to effect a compromise between the achievement of smooth loudness variations and the requirement to preserve the intentions of the content producers.
In this case, there would defined a relative importance S of effecting a smooth loudness transition. If S=1, we have the situation where the transition is as smooth as possible, so that the target loudness values on each side of the junction are equal, as described in the above embodiments. If S=0, we have the "null" case where no gain variation is carried out and the full abruptness of the jump is preserved. In general, the target loudness just before the junction will be P+SA(C−P) and the target loudness just after the junction will be C+S(1−A)(P−C). So the gain is smoothly increased prior to the junction to (1+SA(C−P)/P) times its original value and is smoothly decreased after the junction from (1+S(1−A)(P−C)/C) times its original value. Control of the value of S may be organised as described above for the value of A.

The invention claimed is:

1. A method for controlling loudness across a junction between different types of broadcast content, the method comprising the steps in an audio processor of:
  obtaining at said audio processor a first representative loudness value P before the junction;
  obtaining at said audio processor a second representative loudness value C after the junction in which the second representative loudness value is received from a playout automation system; and
  applying a time-varying audio gain to the content using said audio processor in order to smooth loudness across the junction where:
    said audio gain has an original gain value; and
    said audio gain is smoothly increased prior to the junction to a gain (1+SA(C−P)/P) times higher than the original gain value and is smoothly decreased after the junction from (1+S(1−A)(P−C)/C) times the original gain value;
  where A is a variable parameter between 0 and 1 representing the relative importance of preserving the loudness before and after the junction S is a variable parameter greater than 0 and less than or equal to 1 representing the relative importance of smoothing loudness values and preserving original loudness values.

2. The method according to claim 1, in which the first representative loudness value P is measured over a predefined period before the junction.

3. The method according to claim 1, in which the first representative loudness value P is measured continuously to provide a rolling loudness value.

4. The method according to claim 1, in which the first representative loudness P value is received from a playout automation system.

5. A non-transitory computer readable medium containing programming instructions for instruction for causing a programmable apparatus to implement a method for controlling loudness across a junction between different types of broadcast content, the method comprising the steps of:

obtaining at said audio processor a first representative loudness value P before the junction;

obtaining at said audio processor a second representative loudness value C after the junction in which the second representative loudness value is received from a playout automation system; and applying a time-varying audio gain to the content using said audio processor in order to smooth loudness across the junction;

where:
said audio gain has an original gain value; and
said audio gain is smoothly increased prior to the junction to a gain $(1+SA(C-P)/P)$ times higher than the original gain value and is smoothly decreased after the junction from $(1+S(1-A)(P-C)/C)$ times the original gain value.

* * * * *